(12) United States Patent
Choi et al.

(10) Patent No.: US 7,924,391 B2
(45) Date of Patent: Apr. 12, 2011

(54) LIQUID CRYSTAL DISPLAY MODULE

(75) Inventors: Byung-Jin Choi, Gumi-si (KR);
Ji-Woon Min, Busan (KR);
Kyoung-Sub Kim, Gumi-si (KR);
Hong-Sung Song, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 358 days.

(21) Appl. No.: 12/314,852

(22) Filed: Dec. 17, 2008

(65) Prior Publication Data

US 2010/0073591 A1    Mar. 25, 2010

(30) Foreign Application Priority Data

Sep. 23, 2008 (KR) .................. 10-2008-0093427

(51) Int. Cl.
*G02F 1/1345* (2006.01)
*G02F 1/1333* (2006.01)
(52) U.S. Cl. .................. 349/152; 349/58; 349/149
(58) Field of Classification Search .............. 349/58–60, 349/149, 150, 152
See application file for complete search history.

(56) References Cited

U.S. PATENT DOCUMENTS

| | | | |
|---|---|---|---|
| 6,262,696 B1 * | 7/2001 | Seraphim et al. | 345/1.3 |
| 6,266,119 B1 * | 7/2001 | Takahashi et al. | 349/149 |
| 6,504,587 B1 * | 1/2003 | Morishita et al. | 349/58 |
| 6,636,281 B1 * | 10/2003 | Kanatsu | 349/58 |
| 7,427,212 B2 * | 9/2008 | Hyun et al. | 439/495 |
| 7,431,475 B2 * | 10/2008 | Hafuka et al. | 362/218 |
| 7,522,249 B2 * | 4/2009 | Matsuzaki et al. | 349/149 |
| 7,751,017 B2 * | 7/2010 | Im | 349/151 |
| 7,773,171 B2 * | 8/2010 | Kim et al. | 349/58 |
| 7,817,222 B2 * | 10/2010 | Matsuzaki et al. | 349/58 |
| 2009/0135329 A1 * | 5/2009 | Kim | 349/58 |
| 2010/0007814 A1 * | 1/2010 | Kim | 349/58 |

* cited by examiner

*Primary Examiner* — Rhonda S Peace
(74) *Attorney, Agent, or Firm* — McKenna Long & Aldridge LLP

(57) ABSTRACT

A liquid crystal display module (LCDM) includes a liquid crystal panel; a backlight unit disposed under the liquid crystal panel and projecting light on the light crystal panel; a main frame surrounding a side of the backlight unit and a side of the liquid crystal panel; an integrated printed circuit board (PCB) connected to the liquid crystal panel and disposed at a side surface of the main frame, the integrated PCB including a data unit for providing a data driving signal to the liquid crystal panel, a signal generating unit for generating a data control signal, a gate control signal, and a power source signal and a timing control unit; a connector disposed on the integrated PCB and including a slot along the side surface of the main frame, the connector for receiving a signal from an external unit; a bottom frame under the backlight unit; a system board on a rear side of the bottom frame; a flexible cable connecting the connector and the system board; and a top frame covering edges of the liquid crystal panel and combined with the main frame and the bottom frame.

11 Claims, 6 Drawing Sheets

LIQUID CRYSTAL DISPLAY MODULE

This application claims the benefit of Korean Patent Application No. 10-2008-0093427, filed on Sep. 23, 2008, which is hereby incorporated by reference for all purposes as if fully set forth herein.

BACKGROUND OF THE INVENTION

1. Field of the Invention

The present invents relates to a liquid crystal display module (LCDM), and more particularly, to an LCDM that has light weight and a thin profile.

2. Discussion of the Related Art

As society has entered in earnest upon an information age, a field of display devices that represent all sorts of electrical signals as visual images has developed rapidly and many kinds of flat panel display devices (FPDs), such as liquid crystal display (LCD) devices, plasma display panels (PDPs), field emission display (FED) devices, electroluminescence display (ELD) devices, and so on, have been introduced. Since they have excellent capabilities of a thin profile, light weight and low power consumption, and so on, they are substituted for the cathode ray tube (CRT) rapidly and came into the spotlight.

Among these devices, LCD devices are widely used for notebook computers, monitors, TV, and so on, because of their high contrast ratio and characteristics adequate to display moving images. The LCD device uses an optical anisotropy property and a polarization property of liquid crystal molecules to display images.

The LCD device includes a liquid crystal panel. The liquid crystal panel includes two substrates facing each other and a liquid crystal layer interposed therebetween.

Generally, an additional light source is required because the LCD panel is a non-emissive-type display device. Accordingly, a backlight unit is disposed under the LCD panel. The LCD device displays images using light produced by the backlight unit and supplied to the LCD panel. For example, the backlight unit includes one of a cold cathode fluorescent lamp (CCFL) and an external electrode fluorescent lamp (EEFL) as a light source.

FIG. 1 is an exploded perspective view of a related art LCDM. Referring to FIG. 1, the LCDM includes a liquid crystal panel 10, a backlight unit 20, a main frame 30, a bottom frame 50 and a top frame 40. The liquid crystal panel 10 includes first and second substrates 12 and 14 facing each other and a liquid crystal layer therebetween.

The liquid crystal panel 10 is connected to a gate printed circuit board (PCB) 15 and a data PCB 17 via a flexible circuit board 16 that provide a scanning signal to a gate line of the liquid crystal panel 110 and an image signal to a data line of the liquid crystal panel 110, respectively. The gate and data PCBs 15 and 17 are electrically connected to each other. The gate PCB 15 may be omitted.

The data PCB 17 is connected to a control PCB 19 generating a control signal. A portion of the control signal from the control PCB 19 is applied to the data PCB 17, while the other of the control signal from the control PCB 19 is applied to the gate PCB 15 via the data PCB 17.

The control PCB 19 is electrically connected to the data PCB 17 via a flexible flat cable (FFC) 18. The control PCB 19 can be bent into a rear side of the liquid crystal panel 110 due to a flexible property of the FFC 18.

The backlight unit 20 is disposed at a backside of the liquid crystal panel 10. The backlight unit 20 includes a reflective sheet 22, a lamp 24, a diffusion plate 26 and a plurality of optical sheets 29. The lamp 24 is disposed on the reflective sheet 22. The diffusion plate 26 and the optical sheets 29 are stacked over the lamp 24.

A side support 28 for supporting and fixing the lamp 24 is combined with the bottom frame 50. The liquid crystal display panel 10 and the backlight unit 20 are combined using the main frame 30 that can prevent movement of the liquid crystal panel 10 and the backlight unit 20. The top frame 40 cover edges of the liquid crystal panel 10 and sides of the main frame 30, so the top frame 40 can support and protect of the edges of the liquid crystal panel 10 and sides of the main frame 30. The bottom frame 50 covers back edges of the main frame 30, so the bottom frame 50 is combined with the main frame 30 and the top frame 40 for modulation.

Recently, the LCD device for a portable computer, a desktop computer, a monitor and a wall-mounted television is required to have a wider displaying area with a light weight and a thin profile.

However, since the LCD device requires too many elements, there is a limitation for a light weight and a thin profile.

Particularly, there is a limitation in connection of the data PCB 17 to the control PCB 19. In more detail, the data PCB 17 is electrically connected to the control PCB 19 via a connector (not shown) disposed at both ends of the FFC 18. When the data PCB 17 and the control PCB 19 are connected to each other using the connector, processing costs increase due to the connector. Moreover, an assembling process and a disassembling process are complicated.

The control PCB 19 is combined with an external body by a flexible cable (not shown). In this case, since the control PCB 19 is bent into a rear side of the bottom frame 50, there is also problem in combining the control PCB 19 with the flexible cable.

SUMMARY OF THE INVENTION

Accordingly, the present invention is directed to a LCDM that substantially obviates one or more of the problems due to limitations and disadvantages of the related art.

An advantage of the present invention is to provide a LCDM that has light weight.

Another advantage of the present invention is to provide a LCDM that has a thin profile.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display module (LCDM) includes a liquid crystal panel; a backlight unit disposed under the liquid crystal panel and projecting light on the light crystal panel; a main frame surrounding a side of the backlight unit and a side of the liquid crystal panel; an integrated printed circuit board (PCB) connected to the liquid crystal panel and disposed at a side surface of the main frame, the integrated PCB including a data unit for providing a data driving signal to the liquid crystal panel, a signal generating unit for generating a data control signal, a gate control signal, and a power source signal and a timing control unit; a connector disposed on the integrated PCB and including a slot along the side surface of the main frame, the connector for receiving a signal from an external unit; a bottom frame under the backlight unit; a system board on a rear side of the bottom frame; a flexible cable connecting the connector and the system board; and a top frame covering edges of the liquid crystal panel and combined with the main frame and the bottom frame.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which is illustrated in the accompanying drawings.

Figure 2:
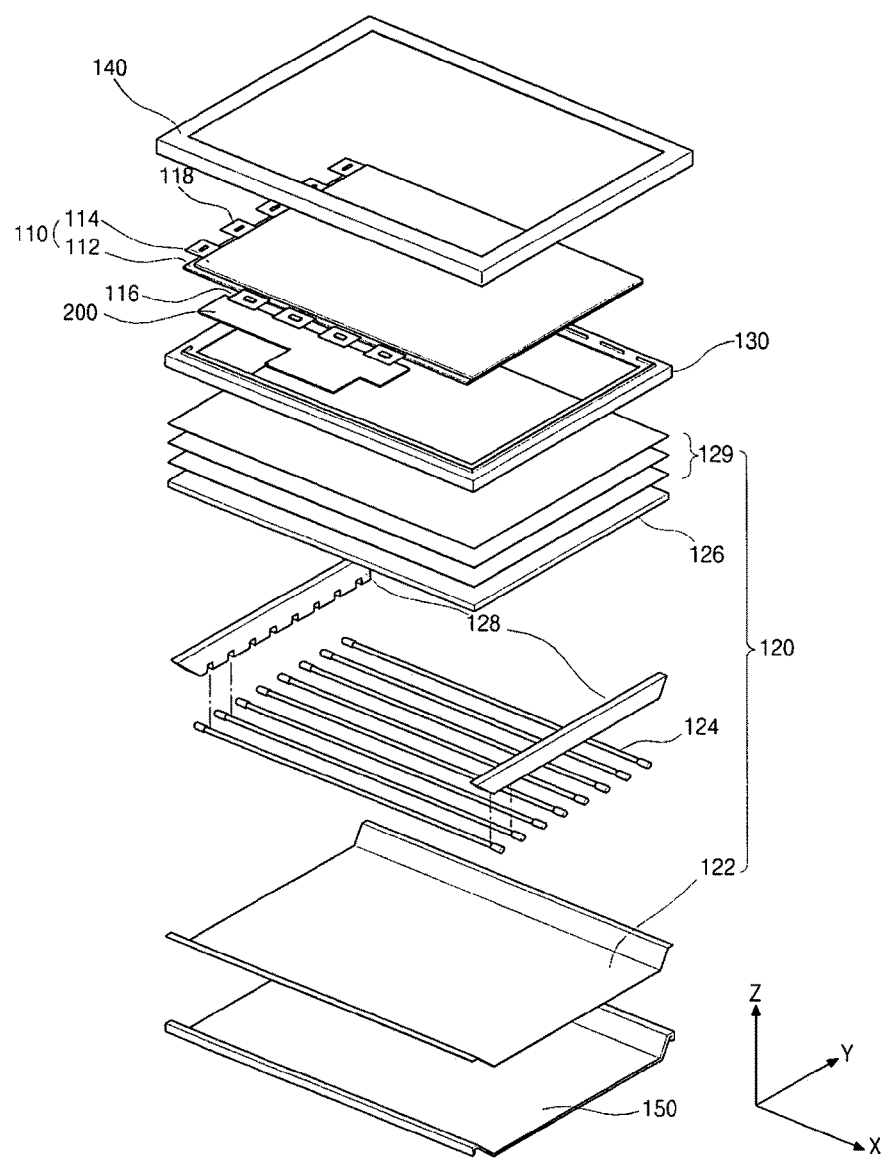
FIG. 2 is an exploded perspective view of an LCDM according to a first embodiment of the present invention.

FIG. 2 is an exploded perspective view of an LCDM according to a first embodiment. In FIG. 2, the LCDM includes a liquid crystal panel 110, a backlight unit 120, a main frame 130, a bottom frame 150 and a top frame 140.

The liquid crystal panel 110 includes first and second substrates 112 and 114 facing each other and a liquid crystal layer (not shown) therebetween. When the liquid crystal panel 110 is driven in an active matrix type, a gate line (not shown) and a data line (not shown), which cross each other to define a pixel region, may be formed on the first substrate 112. The first substrate may be referred to as an array substrate. A thin film transistor (TFT) (not shown) may be disposed at a crossing portion of the gate and data lines. A pixel electrode (not shown) in each pixel region may be connected to the TFT.

A black matrix (not shown) having a lattice shape may be formed on the second substrate 114. The black matrix may corresponds to a non-display region, such as the gate line, the data line and the TFT. A color filter layer (not shown), including red, green and blue sub-color filters and corresponding to each pixel region, may be formed on the second substrate 114. Moreover, a common electrode (not shown) may be formed on the black matrix and the color filter layer. The second substrate 114 may be referred to as a color filter substrate.

In adjacent first and second sides of the liquid crystal panel 110, a gate tape carrier package (TPC) 118 and a data TPC 116 are formed, respectively. The gate TPC 118 and the data TPC 116 are connected to the liquid crystal panel 110. In addition, an integrated printed circuit board (PCB) 200 is disposed at the second side where the data TCP 116 is disposed. The integrated PCB 200 is connected to the liquid crystal panel 110 via the data TCP 116. The integrated PCB 200 functions as both a gate PCB 15 (of FIG. 1) and a control PCB 19 (of FIG. 1).

A plurality of parts for applying a gate driving signal and a data driving signal into the gate TCP 118 and the data TCP 116, respectively, and processing the gate and data driving signals are disposed on the integrated PCB 200.

In addition, a connector (not shown) for a flexible cable may be combined to the integrated PCB 200. An electrical signal from a system board (not shown) may be applied the integrated PCB 200 via the connector and a flexible cable (not shown). Namely, one end of the flexible cable may be connected to the connector, and the other end of the flexible cable may be connected to the system board. The integrated PCB 200 may be bent and closely positioned onto a side surface of the main frame 130 due to a flexible property of the data TPC 116.

Although not shown, first and second alignment layers may be disposed between the first substrate 112 and the liquid crystal layer and between the second substrate 114 and the liquid crystal layer. An initial arrangement of liquid crystal molecules of the liquid crystal layer is determined by the alignment layers. In addition, a seal pattern may be formed along edges of the first and second substrates 112 and 114 to prevent a leakage of the liquid crystal layer. First and second polarization plates may be attached onto an outer surface of each of the first and second substrates 112 and 114.

The backlight unit 120 as a light source is disposed at a backside of the liquid crystal panel 110. The backlight unit 120 includes a reflective sheet 122, a lamp 124, a diffusion plate 126 and a plurality of optical sheets 129. The lamp 124 is disposed on the reflective sheet 122. The diffusion plate 126 and the optical sheets 129 are sequentially stacked over the lamp 124.

A side support 128 for supporting and fixing the lamp 124 is combined with the bottom frame 150. In addition, a space between the lamp 124 and the diffusion plate 126 is to be uniform by the side support 128.

The lamp 124 may be a cold cathode fluorescent lamp (CCFL) or an external electrode fluorescent lamp (EEFL). In addition, the lamp 124 may be a light emitting diode (LED) lamp.

The reflective sheet 122 is disposed under the lamp 124 and reflects light from the lamp 124 into the liquid crystal panel 110 to improve light brightness.

The diffusion plate 126, which is disposed to be spaced apart from the lamp 124 by a pre-determined distance, has various haze properties according to a light uniformity. The haze property of the diffusion plate 126 is controlled by inserting an optical diffusion component, for example, a bead, or forming a fine pattern on a lower surface of the diffusion plate 126. The light from the lamp 124 is diffused by the diffusion plate 126 such that a light concentration is prevented.

The optical sheets 129 on the diffusion sheet 126 include a diffusion sheet and at least one light concentrating sheet. The diffusion sheet is disposed directly on the diffusion plate 126 such that the light through the diffusion plate 126 is further diffused. In addition, the diffusion sheet controls a direction of the light such that the light is incident to the optical concentrating sheet. The light is concentrated by the light concentrating sheet such that the light is provided onto the liquid crystal panel 110.

As a result, the light from the lamp 124 is processed into uniform and high quality light during passing through the diffusion sheet 126 and the optical sheets 129 and is provided onto the liquid crystal panel 110 such that the LCDM displays a high quality image.

The liquid crystal display panel 110 and the backlight unit 120 are combined using the main frame 130 that can prevent movement of the liquid crystal panel 110 and the backlight unit 120. The top frame 140 cover edges of the liquid crystal panel 110 and sides of the main frame 130, so the top frame 140 can support and protect of the edges of the liquid crystal panel 110 and sides of the main frame 130. The bottom frame 150 covers back edges of the main frame 130, so the bottom frame 150 is combined with the main frame 130 and the top frame 140 for modulation.

Figure 3:
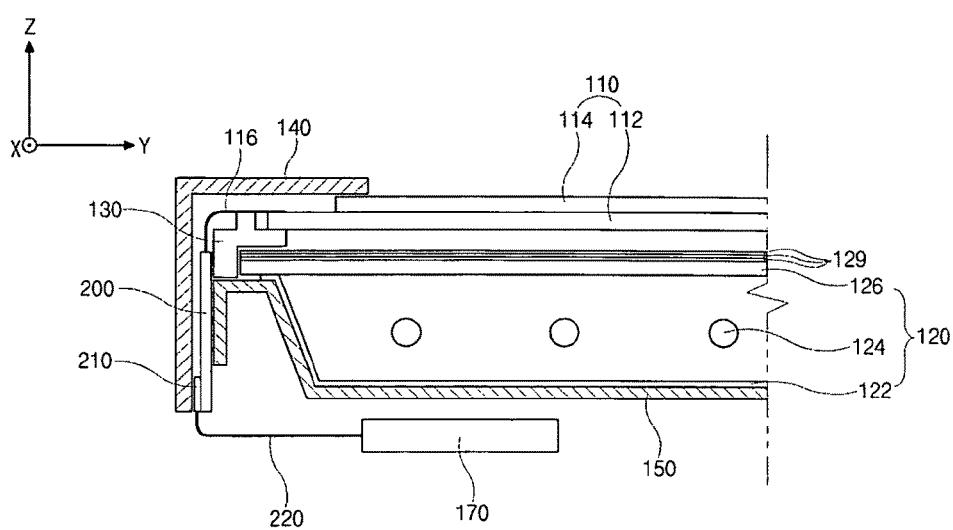
FIG. 3 is a cross-sectional view of a portion of an assembled LCDM according to the first embodiment.
Figure 4:
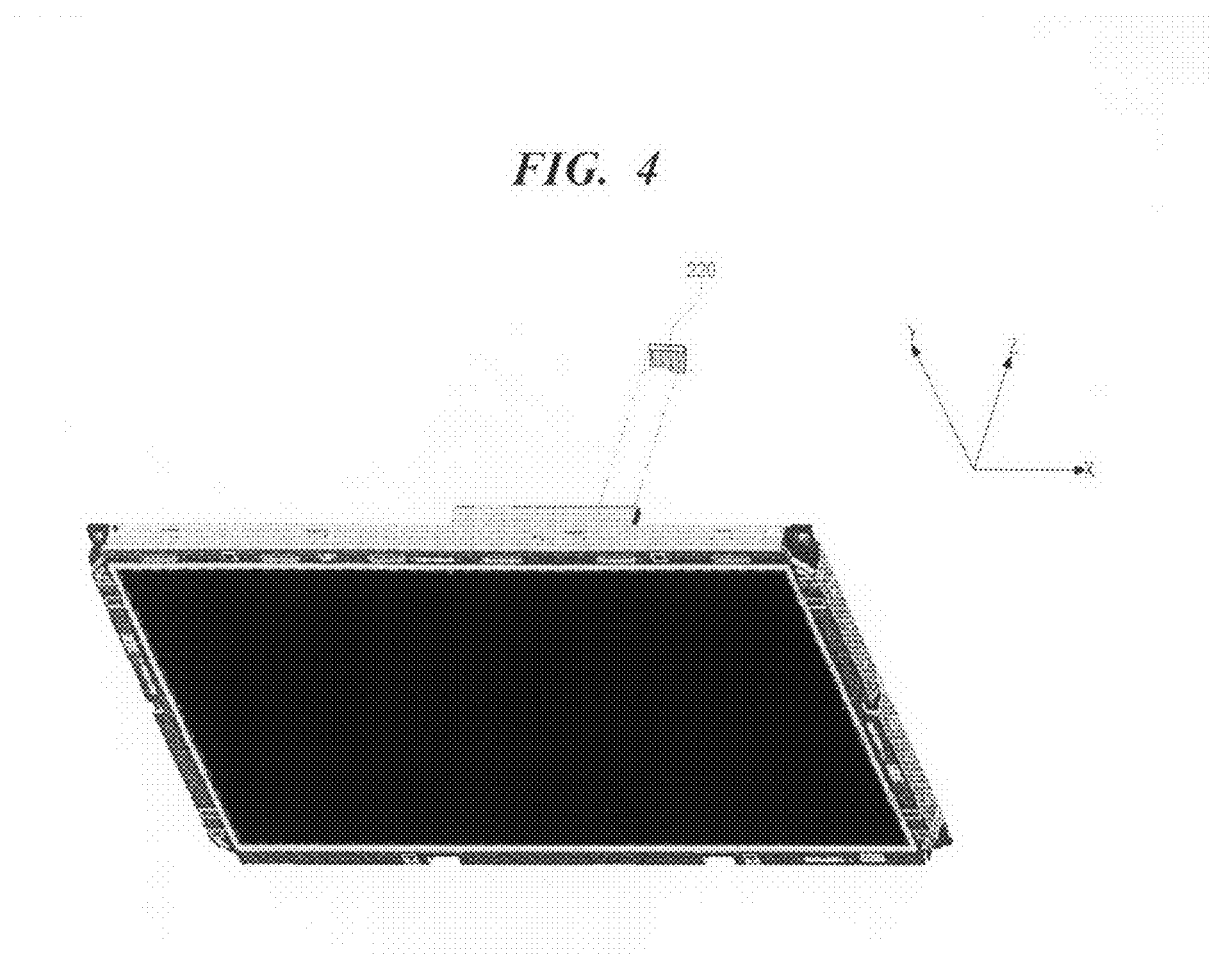
FIG. 4 is a schematic perspective view showing a connection appearance of a flexible cable to an assembled LCDM.

FIG. 3 is a cross-sectional view of a portion of an assembled LCDM according to the first embodiment, and FIG. 4 is a schematic perspective view showing a connection appearance of a flexible cable to an assembled LCDM.

In FIG. 3, the LCDM includes the liquid crystal panel 110, the backlight unit 120, the main frame 130, the bottom frame 150 and the top frame 140. The liquid crystal panel 110 includes the first and second substrates 112 and 114 facing each other and the liquid crystal layer (not shown) therebetween. The backlight unit 120 as a light source is disposed at a backside of the liquid crystal panel 110. The top frame 140 cover edges of the liquid crystal panel 110 and sides of the main frame 130, so the top frame 140 can support and protect of the edges of the liquid crystal panel 110 and sides of the main frame 130. The bottom frame 150 covers back edges of the main frame 130, so the bottom frame 150 is combined with the main frame 130 and the top frame 140 for modulation.

The backlight unit 120 includes the reflective sheet 122, the lamp 124, the diffusion plate 126 and the plurality of optical sheets 129. The reflective sheet 122 is disposed on the bottom frame 150. The lamp 124 is disposed on the reflective sheet 122. The diffusion plate 126 and the optical sheets 129 are sequentially stacked over the lamp 124.

A system board 170 is positioned at a rear side of the bottom frame 150. Although not shown, the system board 170 may include an analog/digital (A/D) board, an inverter, an on screen display (OSD) board, a speaker, an adapter and various cables. The A/D board receives an image signal or an audio signal from an external unit and supplies the image signal or the audio signal into the liquid crystal panel 110 or the speaker to control a displaying image or an audio output. The inverter controls the light source of the backlight unit 120. The OSD board controls a function for adjustment of a screen. The speaker outputs a received audio signal. The adapter supplies a power source into the liquid crystal panel 110.

The first substrate 112 of the liquid crystal panel 110 has a larger size than the second substrate 114 of the liquid crystal panel 110 such that a first edge portion of the first substrate 112 is not covered with the second substrate 114 when attaching the first and second substrates 112 and 114. A plurality of data pads (not shown), which are connected to the data lines (not shown) on the first substrate 112, are disposed in the first edge portion of the first substrate 112.

The data pads are connected to the integrated PCB 200 via the data TCP 116. Various circuits for displaying an image on the liquid crystal panel 110 are disposed on the integrated PCB 200.

Although not shown, a second edge portion, which is adjacent to the first edge portion, of the first substrate 112 is also uncovered with the second substrate 114. A plurality of gate pads), which are connected to the gate lines (not shown) on the first substrate 112, are disposed in the second edge portion of the first substrate 112. The gate pads are connected to the gate TCP.

The integrated PCB 200 is bent and closely positioned onto a side surface of the main frame 130 due to a flexible property of the data TPC 116. The integrated PCB 200 is electrically connected to the system board 170 positioned on the rear side of the bottom frame 150 via a flexible cable 220.

An end of the flexible cable 220 is combined with a connector 210 for the flexible cable 220. The connector 210 is positioned on the integrated PCB 200 to be substantially parallel to the side surface of the main frame 130 such that the end of the flexible cable 220 is combined with the connector 210 to be substantially parallel to the side surface of the main frame 130.

Referring to FIG. 4, the integrated PCB 200 is bent and closely positioned onto a side surface of the main frame 130 due to a flexible property of the data TPC 116, and a terminal, where the end of the flexible cable 220 is combined, of the connector 210 is positioned along the side surface of the main frame 130. The direction along the side surface of the main frame 130 is marked as a "Z" axis. Namely, the end of the flexible cable 220 is inserted into the connector 210 on the integrated PCB 200 along the "Z" axis.

A gate driving signal and a data driving signal are applied into the liquid crystal panel 110 via the gate TCP and the data TCP using signals, for example, power source, an image signal and a control signal, from the system board 170 are applied into the liquid crystal panel 110 such that the liquid crystal panel 110 displays images.

Figure 1:
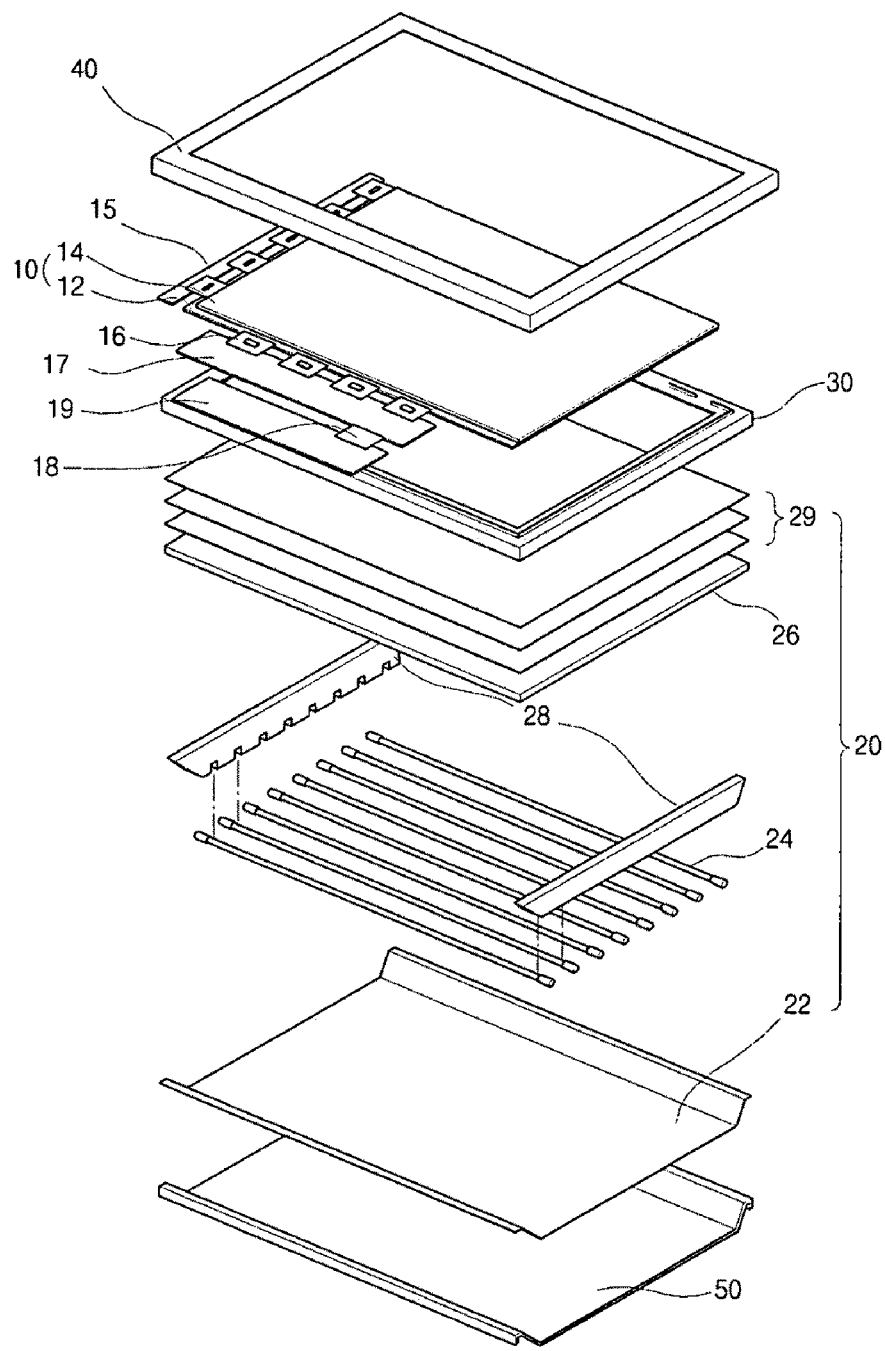
FIG. 1 is an exploded perspective view of a related art LCDM.

As mentioned above, the LCDM includes the integrated PCB 200 having functions of the gate PCB 15 (of FIG. 1), the data PCB 17 (of FIG. 1) and the control PCB 19 (of FIG. 1). Accordingly, there are less PCBs than in the related art LCDM due to the integrated PCB 200.

In addition, since the integrated PCB 200 is positioned on the side surface of the main frame 130 or the bottom frame 150, a length of the data TCP 116 is reduced such that production costs decreases. Moreover, the LCDM has an improved signal transmitting rate due to the reduced length of the data TCP 116.

Furthermore, since the integrated PCB 200 is positioned on the side surface of the main frame 130 or the bottom frame 150, an assembling process of the flexible cable 220 with the integrated PCB 200 is simplified. In the related art LCDM, since the control PCB 19 (of FIG. 1) is bent into a rear side of the bottom frame 50, an assembling process of the flexible cable with the control PCB 19 (of FIG. 1) is complicated.

Figure 5:
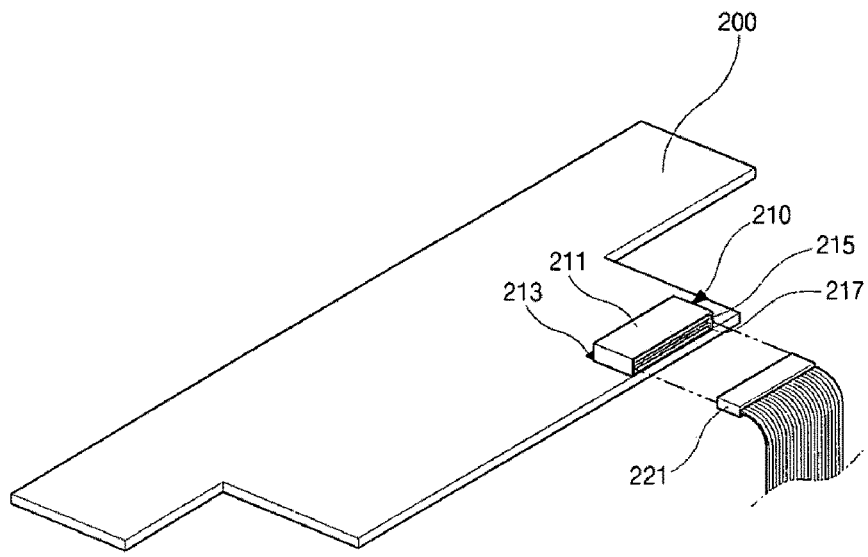
FIG. 5 is a perspective view showing a connection appearance of a flexible cable to an integrated PCB of the LCDM according to the first embodiment.

There may be various modifications in an assembling of the flexible cable 220 with the connector 210 on the integrated PCB 200. An exemplary embodiment for assembling of the flexible cable 220 with the connector 210 is explained with reference to FIG. 5. FIG. 5 is a perspective view showing a connection appearance of a flexible cable to an integrated PCB of the LCDM according to a first embodiment.

In FIG. 5, the LCDM includes the integrated PCB 200. Although not shown, a data unit for applying a data driving signal into the liquid crystal panel 110 (of FIG. 3) using an image signal from an external data processing unit, for example, a computer, and a data unit for applying a gate driving signal into the gate line of the liquid crystal panel 110 (of FIG. 3) are formed on the integrated PCB 200. The integrated PCB 200 applies the gate and data driving signals for driving the LCDM into the gate driver (not shown) and the data driver (not shown), respectively. In addition, the integrated PCB 200 includes a power source unit (not shown) for generating a data control signal, a gate control signal and a power source signal using signals from an external unit, and a timing control unit (not shown).

By these elements, the integrated PCB 200 generates various timing signals such that the gate driving signal is applied into the gate line of the liquid crystal panel 110 (of FIG. 3) via the gate TCP 118 (of FIG. 2) and the data driving signal is applied to the data line of the liquid crystal panel 110 (of FIG. 3) via the data TCP 116 (of FIG. 3).

On the other hand, the gate unit or/and the data unit may be disposed on an additional PCB.

For example, the gate unit (not shown) is formed on an additional PCB and connected to the gate TCP 118 (of FIG. 2). The data unit (not shown) is formed on the integrated PCB 200 and connected to the data TCP 116 (of FIG. 3).

The integrated PCB 200 includes the connector 210 for the flexible cable thereon for receiving driving signals and an image signal from an external unit. The connector 210 includes a housing 211 of an insulating material, a plurality of lead lines 213 and a slot 215. The connector 210 is positioned on a surface of the integrated PCB 200 to be substantially parallel to the side surface of the main frame 130 (of FIG. 3) or the bottom frame 150 (of FIG. 3). The lead lines 213 are formed at one side of the housing 211. Each of the lead lines 213 are electrically connected to a circuit pattern on the integrated PCB 200 by a soldering process.

The slot 215 is formed at another side, which is opposite to the one side of the housing 211, of the housing 211. The slot 215 extends along the side surface of the main frame 130 (of FIG. 3). A plurality of connection pins 217 are arranged inside the slot 215. The connection pins 217 correspond to the lead lines 213, respectively.

The flexible cable 220 is inserted into the connector 210 and has a flexible tape shape. One end of the flexible cable 220 is connected to the connector 210, and the other end of the flexible cable 220 is connected to the system board 170 (of FIG. 3).

A connector holder 221 is disposed at the one end of the flexible cable 220. The connector holder 221 is inserted into the slot 215 of the connector 210 disposed on the integrated PCB 200 such that the flexible cable 220 is electrically connected to the connector 210. The other end of the flexible cable 220 is interconnected with the system board 170 (of FIG. 3) by a thermal pressing process. The connector 210 is one of a female connector and a male connector, and the connector holder 221 is the other one of the female connector and the male connector.

The integrated PCB 200, where the connector 210 is formed, is disposed at the side surface of the main frame 130 or/and the bottom frame 150, while the system board 170 (of FIG. 3) is disposed at the rear side surface of the bottom frame 150. Accordingly, the flexible cable 220 is vertically bent such that the one end of the flexible cable 220 is connected to the connector 210 and the other end of the flexible cable 220 is connected to the system board 170 (of FIG. 3).

Figure 6A:
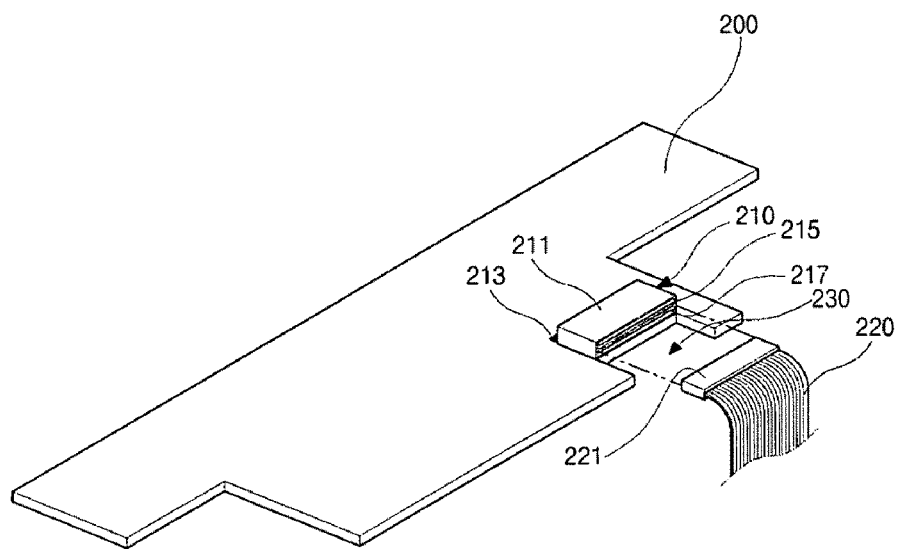
FIGS. 6A and 6B are perspective views showing a connection appearance of a flexible cable to an integrated PCB of the LCDM according to a second embodiment.
Figure 6B:
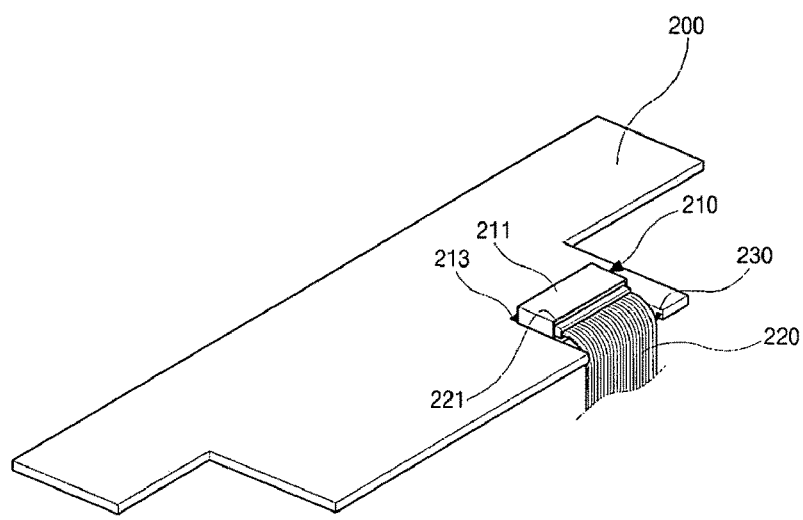

FIGS. 6A and 6B are perspective views showing a connection appearance of a flexible cable to an integrated PCB of the LCDM according to a second embodiment, respectively.

In FIGS. 6A and 6B, the connector 210 for receiving driving signals and an image signal from an external unit (not shown) is formed on the integrated PCB 200. A portion of the integrated PCB 200 is removed. A dent portion from a side of the integrated PCB 200 by removing the portion of the integrated PCB 200 is defined as a chamfer part 230. The connector 210 is positioned to be spaced apart from an edge of the integrated PCB 200 by a predetermined distance. The connector 210 corresponds to the chamfer part 230. A width of the chamfer part 230 may be same as that of the connector 210. The slot 215 faces the chamfer part 230.

The connector 210 includes a housing 211 of an insulating material, a plurality of lead lines 213 and a slot 215. The connector 210 is positioned on a surface of the integrated PCB 200 to be substantially parallel to the side surface of the main frame 130 (of FIG. 3) or the bottom frame 150 (of FIG. 3). The lead lines 213 are formed at one side of the housing 211. Each of the lead lines 213 are electrically connected to a circuit pattern on the integrated PCB 200 by a soldering process.

The slot 215 is formed at another side, which is opposite to the one side of the housing 211, of the housing 211. The slot 215 extends along the side surface of the main frame 130 (of FIG. 3). A plurality of connection pins 217 are arranged inside the slot 215. The connection pins 217 correspond to the lead lines 213, respectively.

The flexible cable 220 is inserted into the connector 210 and has a flexible tape shape. One end of the flexible cable 220 is connected to the connector 210, and the other end of the flexible cable 220 is connected to the system board 170 (of FIG. 3).

A connector holder 221 is disposed at the one end of the flexible cable 220. The connector holder 221 is inserted into the slot 215 of the connector 210 disposed on the integrated PCB 200 such that the flexible cable 220 is electrically connected to the connector 210. The other end of the flexible cable 220 is interconnected with the system board 170 (of FIG. 3) by a thermal pressing process. The connector 210 is one of a female connector and a male connector, and the connector holder 221 is the other one of the female connector and the male connector.

The integrated PCB 200, where the connector 210 is formed, is disposed at the side surface of the main frame 130 or/and the bottom frame 150, while the system board 170 (of FIG. 3) is disposed at the rear side surface of the bottom frame 150. Accordingly, the flexible cable 220 is vertically bent such that the one end of the flexible cable 220 is connected to the connector 210 and the other end of the flexible cable 220 is connected to the system board 170 (of FIG. 3).

There is a limitation in a flexible property of the flexible cable 220 such that a space, where the flexible cable 220 is bent, is required. In addition, the space may be widened depending on a thickness of the connector holder 221.

However, because the integrated PCB 200 in FIGS. 6A and 6B has a chamfer part 230, the flexible cable 220 is bent in the chamfer part 230. Accordingly, an additional space for the flexible cable 220 is required such that a thickness of the LCDM is reduced.

In addition, the flexible cable 220 is easily bent along the rear side surface of the bottom frame 150 (of FIG. 3). Accordingly, an assembling process of the flexible cable with the system board 170 (of FIG. 3) is simplified.

As mentioned above, the LCDM includes the integrated PCB 200 having functions of the gate PCB 15 (of FIG. 1), the data PCB 17 (of FIG. 1) and the control PCB 19 (of FIG. 1). Accordingly, there are less PCBs than in the related art LCDM due to the integrated PCB 200.

In addition, since the integrated PCB 200 is positioned on the side surface of the main frame 130 or the bottom frame 150, a length of the data TCP 116 is reduced such that production costs decreases. Moreover, the LCDM has an improved signal transmitting rate due to the reduced length of the data TCP 116.

Furthermore, since the integrated PCB 200 is positioned on the side surface of the main frame 130 or the bottom frame 150, an assembling process of the flexible cable 220 with the integrated PCB 200 is simplified. In the related art LCDM, since the control PCB 19 (of FIG. 1) is bent into a rear side of the bottom frame 50, an assembling process of the flexible cable with the control PCB 19 (of FIG. 1) is complicated.

The LCDM having the lamp disposed on the reflective sheet is shown. The above backlight unit may be referred to as a direct type. However, the lamp may be disposed at a side of a light guide plate on a reflective sheet. It may referred to as an edge type.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display module (LCDM), comprising:
    a liquid crystal panel;
    a backlight unit disposed under the liquid crystal panel and projecting light on the light crystal panel;
    a main frame surrounding a side of the backlight unit and a side of the liquid crystal panel;
    an integrated printed circuit board (PCB) connected to the liquid crystal panel and disposed at a side surface of the main frame, the integrated PCB including a data unit for providing a data driving signal to the liquid crystal panel, a signal generating unit for generating a data control signal, a gate control signal, and a power source signal and a timing control unit;
    a connector disposed on the integrated PCB and including a slot along the side surface of the main frame, the connector for receiving a signal from an external unit;
    a bottom frame under the backlight unit;
    a system board on a rear side of the bottom frame;
    a flexible cable connecting the connector and the system board; and
    a top frame covering edges of the liquid crystal panel and combined with the main frame and the bottom frame.

2. The LCDM according to claim 1, wherein a chamfer part is formed in a side of the integrated PCB, and the connector corresponds to the chamfer part.

3. The LCDM according to claim 2, wherein the slot faces the chamfer part.

4. The LCDM according to claim 2, wherein a width of the chamfer part is same as a width of the connector 210.

5. The LCDM according to claim 2, wherein the flexible cable is inserted into the slot and bent along the system board in the chamfer part.

6. The LCDM according to claim 1, wherein the integrated PCB further includes a gate unit for providing a gate driving signal into the liquid crystal panel.

7. The LCDM according to claim 1, wherein the slot faces an edge of the integrated PCB.

8. The LCDM according to claim 7, wherein the flexible cable is inserted into the slot and bent along the system board in the chamfer part.

9. The LCDM according to claim 1, wherein the system board includes an analog/digital (A/D) board for receiving an image signal or an audio signal from an external unit and supplying the image signal or the audio signal into the liquid crystal panel, an inverter controlling the light source of the backlight unit, an on screen display (OSD) board for controlling a function for adjustment of a screen, a speaker for outputting a received audio signal and an adapter for supplying a power source into the liquid crystal panel.

10. The LCDM according to claim 1, wherein the backlight unit includes:
    a reflective sheet on the bottom frame;
    a lamp on the reflective sheet;
    a diffusion plate over the lamp; and
    an optical sheet on the diffusion sheet.

11. The LCDM according to claim 1, wherein the backlight unit includes:
    a reflective sheet on the bottom frame;
    a light guide plate on the reflective sheet;
    a lamp at a side of the light guide plate;
    a diffusion plate over the light guide plate; and
    an optical sheet on the diffusion sheet.

* * * * *